EDGE CONNECTORS

Filed Jan. 26, 1956 2 Sheets-Sheet 1

INVENTORS
ALBERT BLAIN
WILLIAM J. BARTIK
GEORGE C. CORDIVARI
BY Charles C. English
AGENT Feb. 23, 1960 A. BLAIN ET AL 2,926,340

EDGE CONNECTORS

Filed Jan. 26, 1956 2 Sheets-Sheet 2

INVENTORS
ALBERT BLAIN
WILLIAM J. BARTIK
BY GEORGE C. CORDIVARI

Charles C. English
AGENT

United States Patent Office
2,926,340
Patented Feb. 23, 1960

2,926,340

EDGE CONNECTORS

Albert Blain, Philadelphia, William J. Bartik, Hatboro, and George C. Cordivari, Philadelphia, Pa., assignors to Sperry Rand Corporation, New York, N.Y., a corporation of Delaware Application January 26, 1956, Serial No. 561,504
18 Claims. (Cl. 340—174)

The present invention relates to connector structures for use in various electrical circuit arrangements; and is more particularly concerned with improved connector devices adapted to electrically interconnect a plurality of circuit boards, for instance of the type utilizing printed circuit techniques. As will be described, the connectors of the present invention find particular utility when employed in connection with memory systems, for instance of the type comprising magnetic core matrices.

In many forms of circuit structures, such as those employed in digital or other computer devices, the circuits themselves are mounted on a plurality of circuit boards which must be somehow interconnected to provide an operative system. Many such circuit boards employ printed circuit techniques, and the interconnection of these boards which are placed, for instance, face-to-face or back-to-back and substantially in parallel with one another, has in the past necessitated a rather expensive and laborious procedure comprising the individual soldering of many thousands of connecting wires between the boards; or in the alternative, the individual wiring of such connectors in combination with a dip-soldering technique. These techniques known heretofore, have caused the resultant circuits to be relatively expensive, due to the considerable time required for the actual wiring of the over-all circuit. In addition, the connection techniques employed have resulted in a final circuit configuration wherein individual connectors are relatively difficult to install or remove, and wherein relatively large spacing is required between individual connectors.

The present invention serves to obviate these known difficulties and provides improved tab connectors for the interconnection of two or more circuit boards either in series or parallel connection; and further provides an over-all circuit wherein any bad connector can be quickly and inexpensively replaced. In addition, as will become apparent from the subsequent description, the improved connectors of the present invention are considerably cheaper than those known heretofore; provide very reliable electrical connections; permit much closer spacing between conductors; and obviate the necessity for ordering or providing special connectors having a fixed number of conductors.

It is accordingly an object of the present invention to provide improved connectors for electrically coupling a plurality of circuit boards to one another.

A further object of the present invention resides in the provision of an improved circuit board structure which facilitates interconnection of the said structure with similar structures.

Another object of the present invention resides in the provision of an improved method and apparatus for electrically interconnecting a plurality of printed circuit boards.

A further object of the present invention resides in the provision of an improved memory system having greater reliability than those known heretofore.

Still another object of the present invention resides in the provision of printed circuit structures comprising a plurality of circuit boards in combination with improved means for interconnecting those boards in any desired electrical configuration.

A still further object of the present invention resides in the provision of improved connectors which are much cheaper than those known heretofore and which can be installed and removed more easily while still permitting much closer spacing between adjacent connectors than has been the case heretofore.

A further object of the present invention resides in the provision of improved tab connectors for electrically coupling circuit boards to one another thereby to provide a more reliable connection both from an electrical and mechanical standpoint between the boards than has been the case heretofore.

In providing for the foregoing objects and advantages, the present invention utilizes improved tab connector devices in combination with a circuit board having a novel edge configuration. The boards themselves may comprise a non-conductive material, and may be substantially rectangular in configuration. The several edges of such boards are slotted. These slots are coated with conductive material, for instance by a plating operation, and the several slots so coated may be connected, for instance by printed circuit techniques, to a further circuit carried by an individual board. Several boards so constructed may thus be interconnected with one another through the insertion of conductive tabs between appropriate slots on different ones of the said boards. These tabs may take a variety of configurations in order to cooperate selectively with a variety of possible slot configurations in the several boards, as will be described.

In a particular embodiment of the present invention, the aforementioned circuit boards may comprise a substantially rectangular frame and a plurality of supporting wires disposed in a plurality of coordinates and cooperating with a plurality of magnetic cores, thereby to provide an information storage device. The conductors in such a storage device may be connected to the aforementioned edge slots in the board by printed circuit conductors whereby a plurality of such individual memory units may be interconnected by the novel edge connectors of the present invention, thereby to effect an over-all memory system having a relatively large storage capacity.

The foregoing objects, advantages, construction and operation of the present invention will become more readily apparent from the following description and accompanying drawings, in which:

Figure 1 diagrammatically illustrates an arrangement utilizing a plurality of circuit boards interconnected in accordance with the present invention;

Figure 1:
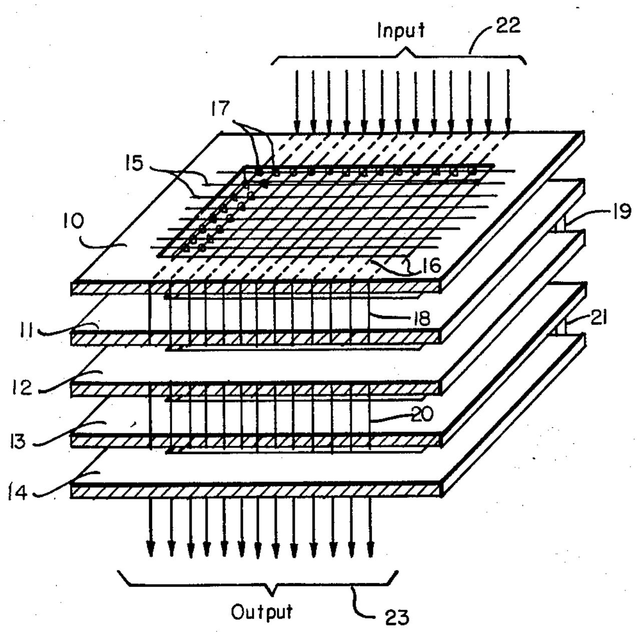

Referring now to Figure 1, it will be seen that in accordance with the present invention, a relatively complex circuit for use in various electrical installations may comprise a plurality of boards 10 through 14 inclusive; and these boards may be stacked in substantially parallel relationship, face-to-face or back-to-back. The boards 10 through 14 may have various circuit components mounted thereon, or may have printed circuits placed thereon. In the alternative, and in the particular form of the invention illustrated in Figure 1, the boards 10 through 14 may take the form of substantially rectangular frames supporting a plurality of wires 15 and 16, for instance, for cooperation with a plurality of toroidal cores, such as 17, whereby a magnetic core matrix forming an information storage system results. It will be appreciated that while the wires 15 and 16 are intended to illustrate control lines in two coordinates for the memory system shown in Figure 1, more than two coordinates may in fact be provided, and such an expanded structure is contemplated by the present invention.

When the boards 10 through 14 each take the form of a memory system of the type specifically illustrated in reference to board 10, over-all memory devices having a relatively large storage capacity may be effected by the interconnection of a plurality of such boards. The boards may, for instance, be connected in series with one another. That is, a plurality of edge connectors 18 may be provided between boards 10 and 11; a further plurality of edge connectors 19 may be provided between boards 11 and 12; a still further plurality of edge connectors 20 may be provided between boards 12 and 13; and still another plurality of edge connectors 21 may be provided between boards 13 and 14. Input signals appearing on the input lines 22 thus pass via lines 16, edge connectors 18, the board 11, edge connectors 19, the board 12, edge connectors 20, the board 13, edge connectors 21, and the board 14, to output lines 23.

The foregoing description, of course, relates to a series connection of the boards in one coordinate only, and similar series connections may be effected in the other coordinates of the board, for instance by providing further edge connectors associated, for instance, with lines 15, and disposed between the edges of the boards which are substantially orthogonal to those edges associated with edge connectors 18 through 21. It will further be appreciated that although a series connection has been discussed, the several boards may be selectively connected in parallel, for instance by providing edge connectors between two adjacent boards, which edge connectors are associated with two opposite or parallel edges of each of the boards. Various combinations of such parallel and series connections may, of course, be desirable depending upon the ultimate form the circuit is to take.

In the past, when the boards 10 through 14 have taken the form illustrated, or one of the other types of circuit structures described, connections between adjacent parallel boards have been effected by a wiring and soldering technique whereby the over-all circuit is quite expensive. In addition, because of the soldering techniques employed, it has been relatively common to find that one or more of the soldered connections is inferior or defective thereby rendering the over-all circuit unreliable. Furthermore, these inferior connections have been difficult to locate because of the many thousands of such connections which might comprise an over-all circuit; and even when located, have been extremely difficult to replace because of the form of the connection.

The present invention obviates these difficulties and actually permits a more reliable and less expensive over-all circuit to be effected while at the same time allowing the several edge connectors to be more closely spaced to one another than has been the case heretofore.

In providing for these objects, the circuit boards of the present invention are slotted along their edges, and such slotting is preferably placed along all four edges of any given rectangular board thereby to permit insertion of tab connectors and interconnection of boards in several coordinates, and in several possible circuit configurations. The boards themselves may be non-conductive in nature, whereby the circuit thereon may be of the printed type; and the slotted edges of the said boards may be coated with conductive material by known techniques. When such novel boards are employed, several such boards may thereafter be electrically and mechanically interconnected by the aforementioned simple expedient of placing a connecting tab of conductive material between corresponding slots in two or more adjacent boards.

Figure 2:
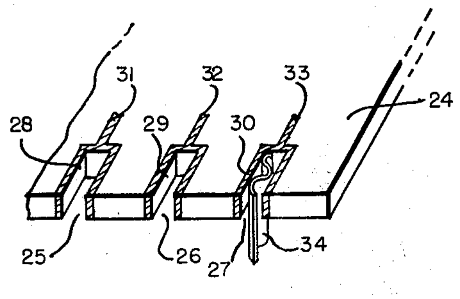
Figure 2 is a partial representation of one form of the edge slot and tab connector combination in accordance with the present invention.

The above described slots and tabs may take a variety of configurations in accordance with the present invention. thus, referring to Figure 2, it will be seen that in accordance with one embodiment of the present invention, a board 24 may have a plurality of straight-sided slots 25, 26, 27, etc. formed in the edges thereof. These slots may be coated with electrically conductive material along their internal and external walls, for instance, as indicated at 28, 29 and 30. The conductive coatings so disposed on the walls of the several slots may be coupled to circuits on the board 24 by printed circuit lines such as 31, 32, 33, etc. whereby the said circuit on board 24 is interconnected with the conductive slots 25 through 27, etc. at the edges of the board. Several boards of the type illustrated and described in reference to Figure 2 may thereafter be interconnected by inserting a tab connector such as 34 between appropriate slots in two or more of the said boards. When so inserted, the tab connectors are disposed substantially orthogonal to the interconnected boards in the manner illustrated and described in reference to connectors 18 through 21 of Figure 1.

In the particular example illustrated in Figure 2, the conductive tab 34 has a serpentine cross-section, thereby to provide a plurality of conductive connection points between tab 34 and the conductive walls 30 of the slot 27. The dimensions of the slots and tab connectors are so chosen that a relatively rigid connection is effected through the insertion of a tab into the several slots to be interconnected; and various forms of tab connectors providing such a connection can be provided in accordance with the present invention.

Figure 3A:
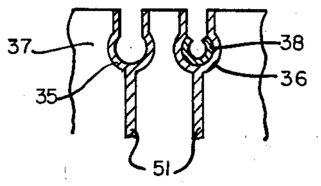
Figures 3A, 3B and 3C illustrate alternative edge slot configurations in accordance with the present invention.
Figure 3B:
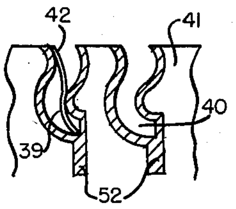
Figure 4A:
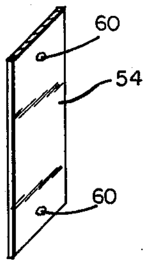
Figures 4A through 4F inclusive depict various tab configurations which may be selectively employed in conjunction with the slots of Figure 2 and of Figures 3A through 3C.
Figure 4B:
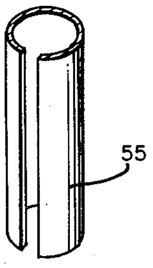

The edge connector slots described in reference to Figure 2 have been straight-sided in configuration; but as mentioned previously, other forms of slot configurations may be utilized. Thus, as shown in Figure 3A, the slots may be substantially circular in configuration, such as at 35 and 36; and when several boards such as 37 are so slotted, they may be interconnected by tabs 38 having the form of a split cylinder (see Figure 4B). In the alternative, as shown in Figure 3B, the slots rather than being straight-sided or circular, may be serpentine in configuration, as illustrated at 39 and 40; and a board such as 41 defining slots 39 and 40, may be interconnected with similarly slotted boards by a tab connector such as 42, which in its unstressed form may be substantially planar in configuration (see (Figure 4A).

Figure 3C:
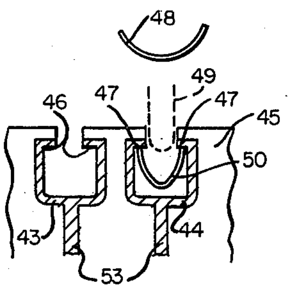

A still further embodiment of the present invention is illustrated in Figure 3C, and the edge connector slots 43 and 44, shown in that figure as associated with the board 45, define internal shoulders such as 46 and 47 to provide a locking action between the several slots and their associated tabs. When this latter form of the invention is employed, the tab connector may be inserted into the slot, as at 49, and which, when so inserted, resiliently springs outward, as at 50, to lock on the internal shoulders 47 of the slot 44.

It will be appreciated, of course, that in each of the embodiments shown in Figures 3A through 3C, as well as in modifications thereof, the several tabs comprise conductive material and the interior walls of the several slots are conductively coated, thereby to provide an electrical connection between the conductive tabs and the said slots. It will further be appreciated that, as described in reference to Figure 2, the several slots may be interconnected with circuits carried by the boards through printed circuit lines such as 51, 52 and 53.

It has been mentioned previously that a number of tab configurations may be utilized in accordance with the present invention. Certain possible such tabs are illustrated in Figures 4A through 4F, and these may take the form of a straight-sided member 54 (Figure 4A), a split cylinder or rivet 55 (Figure 4B), a half circular connector 56 (Figure 4C), a reversed conductor

Figure 4C:
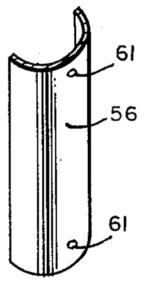
Figure 4D:
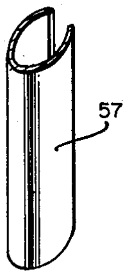
Figure 4E:
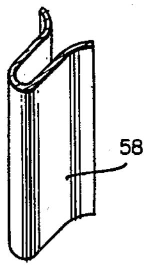
Figure 4F:
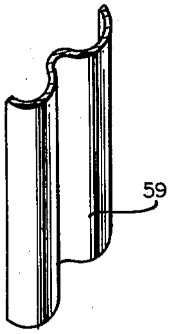

57 having the separate edges thereof facing one another (Figure 4D), a reversed conductor 58 having the separate edges faced outwardly with respect to one another (Figure 4E), or a serpentine connector 59 (Figure 4F). The connector 59 shown in Figure 4F has already been illustrated and described as connector 34 in reference to Figure 2, but it should be noted that the straight-sided slot shown in Figure 2 can also cooperate with tabs such as tabs 56, 57 or 58. The circular slots shown in Figure 3A are adapted to cooperate particularly with a tab connector 38 or 55, of the type shown in Figure 4B; and similarly, the serpentine slots 39 and 40 shown in Figure 3B are adapted to cooperate particularly with straight-sided connectors such as 42 or 54, shown in Figure 4A. In practice, each of the tabs shown in Figure 4 comprises a resilient or flexible conductive material, and the said tabs are physically pushed through the slots in the several boards to effect the desired interconnection. In the cases of the tabs shown in Figures 4B through 4F inclusive, this insertion step preferably comprises depression of the tab upon itself, insertion into the slots, and release of the tab whereby spring action of the tab holds it in place.

It should further be noted that while the several tab connectors, when inserted between adjacent circuit boards, provide a relatively rigid connection, further rigidity may be effected by dimpling the tab connectors, thereby to prevent the tabs from inadvertently slipping from their appropriate slots. Such dimples are illustrated at 60 in reference to connector 54 (Figure 4A), and at 61 in connection with tab 56 (Figure 4C).

While the foregoing description has related to preferred embodiments of the present invention, many variations will be suggested to those skilled in the art; and certain of these variations have already been discussed. It must therefore be stressed that the foregoing is meant to be illustrative only and should not be considered limitative of our invention; and all such variations as are in accord with the principles described are meant to fall within the scope of the appended claims.

Having thus described our invention, we claim:

1. A circuit structure comprising a plurality of boards, each of said boards comprising a non-conductive material and having an electrical circuit thereon, a plurality of slots in the edges of said boards, each of said slots having a conductive material on the inner walls thereof, means electrically connecting said circuits to said conductive slots, and a plurality of elongated conductive tabs of resilient material inserted respectively between slots in a plurality of said boards, the normal dimensions of said tabs being so selected with respect to the dimensions of said slots that said tabs assume a stressed configuration upon insertion into said slots whereby said tabs are resiliently retained in said slots thereby to effect a readily removable electrical connection between said circuits via said slots.

2. The structure of claim 1 wherein said boards are substantially parallel to one another, said tabs being substantially orthogonal to said boards.

3. The structure of claim 1 wherein each of said circuits comprises a magnetic core memory system.

4. The structure of claim 1 wherein said slots are substantially rectangular in cross-section.

5. The structure of claim 1 wherein said slots are substantially circular in cross-section.

6. The structure of claim 1 wherein said slots are substantially serpentine in cross-section.

7. The structure of claim 1 wherein each of said slots includes an internal retaining shoulder for maintaining said tabs in locked relationship within said slots.

8. A circuit structure comprising a plurality of planar boards of non-conductive material disposed in stacked superposed relation to one another, each of said boards having a plurality of slots disposed substantially parallel to one another along an edge of said board, the slots in each of said boards having corresponding slots in the other of said boards, conductive material coating the internal walls of said slots in each of said boards, a circuit on each of said boards, conductive means connecting portions of each of said circuits to said conductive slots on its corresponding board, and a plurality of conductive tabs of resilient material inserted into and extending between corresponding slots in a plurality of said boards in directions substantially perpendicular to the planes of said boards, said tabs being stressed to resiliently bear upon a plurality of points within each of said slots thereby to separably connect the circuits on said plurality of boards to one another.

9. The circuit of claim 8 wherein said slots in each of said boards are disposed respectively along a plurality of edges of said board.

10. The structure of claim 9 wherein said conductive means on each of said boards comprises a plurality of printed circuit conductors.

11. The structure of claim 10 wherein at least one of said boards comprises a rectangular frame, said circuit on said one of said boards comprising a magnetic core matrix supported by said frame, said conductive slots being located in the edges of said frame.

12. Circuit means comprising a plurality of circuit boards disposed substantially parallel to one another, said circuit boards being fabricated of insulating material, a circuit affixed to each of said boards, a plurality of slots in each of the edges of each of said boards, the edge slots in each of said boards having corresponding edge slots in another of said boards, a conductive means on the inner surfaces of said slots, conductor means coupling the circuits on each of said boards to said conductive means on the slots of said board, and conductive tabs of resilient material extending from the slots in one of said boards to the slots in another of said boards for electrically interconnecting said circuits, each of said tabs being stressed and resiliently retained in said slots.

13. The combination of claim 12 wherein said slots are circular in cross-section, said tabs being substantially of hollow split cylindrical configuration.

14. The combination of claim 12 wherein said slots are serpentine in cross-section, said tabs being substantially rectangular whereby said tabs bear resiliently upon a plurality of spaced points within said serpentine slots.

15. The combination of claim 12 wherein said slots are rectangular in cross-section.

16. The combination of claim 12 wherein each of said tabs includes projecting means to prevent said tabs from sliding in said slots in directions perpendicular to the planes of said circuit boards.

17. A stack of printed circuit cards comprising a plurality of said cards each having a board composed of a non-conducting material, and having at least one printed circuit thereon, a plurality of slots in the edges of said boards, conducting means around said slots, means electrically connecting said circuits to said conductive means around said slots, and a plurality of conductive connectors made of springy material each being selectively inserted between corresponding slots in a plurality of said cards, said connectors being constructed so that they assume a compressed configuration upon insertion into said slots whereby said connectors are resiliently retained in said slots thereby to effect a readily removable electrical connection between said circuits on said cards via said conductive means around said slots.

18. A stack of printed circuit cards comprising a plurality of cards composed of a non-conducting material, a plurality of slots in the edges of said cards, conducting means around said slots, a plurality of conductors electrically connected to certain of said conducting means around said slots, a plurality of magnetic core structures linked by certain of said conductors so that said cores form a matrix arrangement, and a plurality of electrically conductive connector tabs made of springy material insertable between corresponding slots in a plurality of said cards, said connectors being constructed to assume a compressed configuration upon insertion into said slots whereby said tabs are resiliently retained in said slots thereby to effect a readily removable electrical connection between said matrices on said cards via said conductive means around said slots.

References Cited in the file of this patent

UNITED STATES PATENTS 1,630,936 Godley ---------------- May 31, 1927

2,524,939 Stephan et al. ---------- Oct. 10, 1950
2,700,150 Wales ---------------- Jan. 18, 1955
2,712,126 Rosenberg et al. -------- June 28, 1955
2,740,097 Edelman --------------- Mar. 27, 1956

FOREIGN PATENTS 357,171 Great Britain ---------- Sept. 10, 1931

OTHER REFERENCES

Murray, A. F.: Tele-Tech, November 1953, pages 12 and 70.